(12) United States Patent
Koivuaho

(10) Patent No.: US 7,612,559 B2
(45) Date of Patent: Nov. 3, 2009

(54) METHOD AND SYSTEM FOR CONTINUOUS POSITION DETECTION OF MOVING PARTS IN RELATION TO EACH OTHER

(75) Inventor: Vesa Koivuaho, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/480,024

(22) Filed: Jun. 29, 2006

(65) Prior Publication Data

US 2008/0001598 A1    Jan. 3, 2008

(51) Int. Cl.
*G01R 33/02* (2006.01)
(52) U.S. Cl. .................................... 324/244; 455/575.3
(58) Field of Classification Search .............. 324/207.2, 324/207.21, 244, 207.11, 252, 207.24, 260, 324/235; 338/32 R, 32 H; 335/192, 215, 335/170, 78, 85; 455/575.3, 575.1, 556.1, 455/556.2
See application file for complete search history.

(56) References Cited

U.S. PATENT DOCUMENTS 5,525,907 A * 6/1996 Frazier ....................... 324/334
7,285,951 B2 * 10/2007 Lescourret ............. 324/207.17

* cited by examiner

*Primary Examiner*—Reena Aurora
(74) *Attorney, Agent, or Firm*—Harrington & Smith, PC

(57) ABSTRACT

The invention relates to a method and system for continuous position detection using a contact-free detection technology. An arrangement includes a magnetic field source and magnetometer sensor, where the magnetic field source is adapted to generate a first magnetic field density and a sequential second magnetic field density determined by said magnetometer sensor. The sign of the determined first magnetic field generated by said magnetic field source is opposite than the second determined magnetic field generated by said magnetic field source. In addition the arrangement is adapted to compensate an offset drifting caused by the magnetic field environment and to determine a distance between the magnetic field source and magnetometer sensor based on the difference of the first magnetic field density and the sequential second magnetic field density determined by said magnetometer sensor.

26 Claims, 5 Drawing Sheets

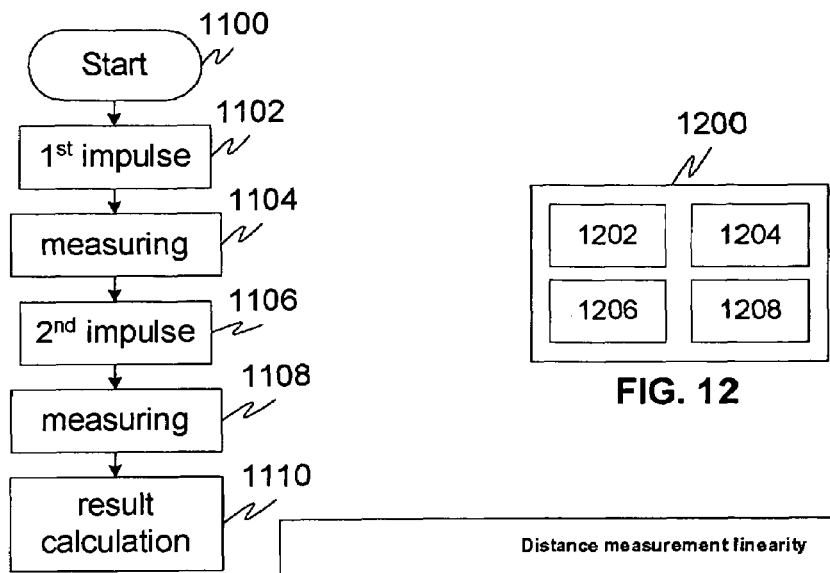
FIG. 11
FIG. 12
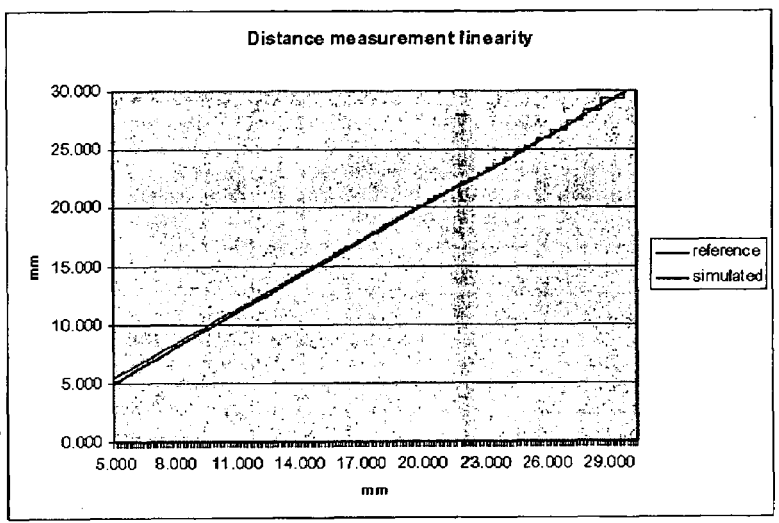
FIG. 10a
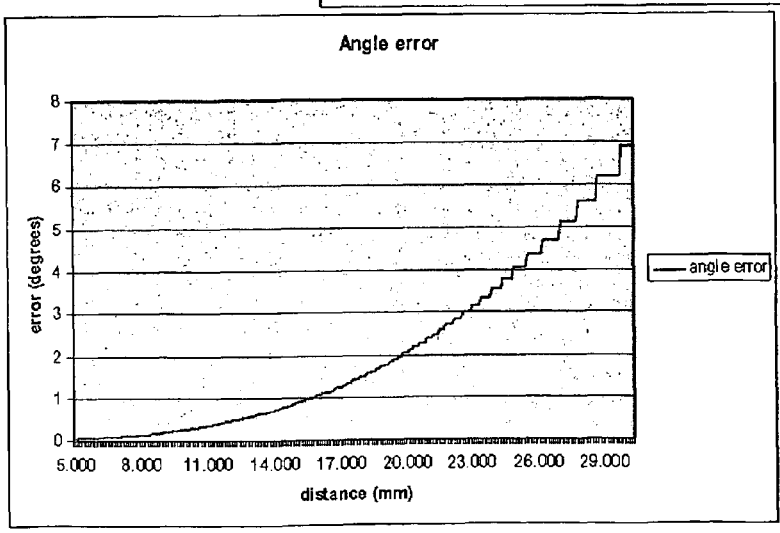
FIG. 10b

METHOD AND SYSTEM FOR CONTINUOUS POSITION DETECTION OF MOVING PARTS IN RELATION TO EACH OTHER

TECHNICAL FIELD OF THE INVENTION

The invention relates to method and system for continuous position detection/context sensing (meaning a "short term" or local detection on limited movement environments) using a contact-free detection technology. Especially the invention relates to a method using a magnetic field source and magnetometer for position detection in a local environment, where the position detection may relate for example to the relative position of two parts moveable in proportion to each other, such as moveable parts of a mobile device.

BACKGROUND OF THE INVENTION

Different kinds of methods are used for position detection for example in mobile equipment environment. Many of them are based on a contact-free detection technology, such as a magnetic field measurement technology, where magnetic field properties on a local User interface environment are measured. Position detection/context sensing on a mobile equipment level enhances user interface functions, where the position detection function performs for example open and close actions (producing typically ON/OFF-signals).

Generally the magnetic field measurement technology has great advantages but also some disadvantages which effects lack of performance for detection. One of the main problems of magnetic field detection technology is offset disturbance or error on measurement range. Offset problem is coming both from internal (inside the component) and external (inside the equipment) sources.

Internal error affecting to an offset has only a local term, and the error does not typically depend on a position of moving parts. Internal error may be normalized, especially if it is linear and symmetric, but it can still reduce a measurement dynamic range. Moreover the saturated offset could be a fatal error. Temperature may also affect an internal error, which may be normalized especially if it is linear or well-known nonlinear-type. In addition a noise may be one internal error type. A noise is typically not possible to normalize, but effect of the noise can be reduced with sample statistics (filtering). However it can be said that the noise reduces a measurement dynamic range.

External disturbance affecting to an offset has also a local term (inside the equipment) but also a global term, such as Earth's magnetic field, which is weak but needs to take care. Also steady magnets, electric motors, speakers and power lines are possible external error sources and their effects depend on a position to an error source. Offset type changes can possibly be normalized. In addition a noise may also be an external error type, which typically relates environmental like magnetic field changes. Typically it can't be normalized, but effects of noise can be reduced for example with sample statistics (filtering) if error trend is quite slow.

In addition it should be noted that a wide offset variation potential reduces a distance and direction measurement performance.

Stronger magnetic field density will solve many of the problems mentioned above but it is not reasonable because magnetic field can for example destroy or reset the credit card magnetic strips or disturb other electronic devices and their operations. Moreover the problem disclosed above can also be solved with adapting the existing offset level. This however affects inaccuracy for detection when offset level changes. This also affects needs for calibration during function usage.

Therefore, the continuous position detection/context sensing with magnetometer technology will strongly need an appropriate method for reliable and sharp offset effects compensation and error minimization. Especially the need exist for a solution to prevent or minimize disadvantages of magnetic field measurement on local environment.

SUMMARY OF THE INVENTION

The present invention offers a solution for an offset drifting and error minimizing. This solution can also be exploited to fulfil the need arisen in the field of magnetic field measurement technology, as described earlier in this document. In the present invention, the offset drifting can be compensated and errors minimized by measuring a magnetic field stimulus caused by a changing polarisation of the magnetic field produced by a magnetic field source.

In order to compensate an offset drifting, as well as to minimize errors, two different measurements are performed in the measuring phase, namely the first measurement before the changing of the field polarization and the second measurement after the changing of the field polarization. After measurement the result of the position detection can be determined from the difference of these two measurements. An advantageous embodiment of the invention is based on a one, two or even three dimensional magnetometer sensor and a magnetic field source, which can generate magnetic excitation detectable by the magnetometer. The generated magnetic excitation is measured with the one, two or three dimensional magnetometer sensor based on differentially. The magnetic field source may be a coil or a permanent magnet actuator, for example.

It is characteristic for an arrangement in accordance with the invention to comprise a magnetic field source and magnetometer sensor, where the magnetic field source is adapted to generate a first magnetic field density and a sequential second magnetic field density determined by said magnetometer sensor, where a sign of the determined first magnetic field generated by said magnetic field source is opposite than the second determined magnetic field generated by said magnetic field source, where the arrangement is adapted to compensate an offset drifting caused by the magnetic field environment and to determine a distance between the magnetic field source and magnetometer sensor based on the difference of the first magnetic field density and the sequential second magnetic field density determined by said magnetometer sensor.

It is characteristic for a method in accordance with the invention to comprise generation by a magnetic field source of a first magnetic field density and a sequential second magnetic field density determined by a magnetometer sensor, where a sign of the first determined magnetic field generated by said magnetic field source is opposite than the second determined magnetic field generated by said magnetic field source, compensating an offset drifting caused by the magnetic field enviroment and determining a distance between the magnetic field source and the magnetometer sensor based on the difference of the first magnetic field density and the sequential second magnetic field density determined by said magnetometer sensor.

It is characteristic for a mobile device in accordance with the invention to comprise a first part and a second part movable attached to said first part, the mobile device further comprising an arrangement comprising of a magnetic field source and magnetometer sensor, where the magnetometer sensor is arranged in said first part and the magnetic field source is arranged to said second part of the mobile device, where the magnetic field source is adapted to generate a first magnetic field density and a sequential second magnetic field density determined by said magnetometer sensor, where a sign of the determined first magnetic field generated by said magnetic field source is opposite than the determined second magnetic field generated by said magnetic field source, where the arrangement is adapted to compensate an offset drifting caused by the magnetic field enviroment and to determine a distance between the magnetic field source and magnetometer sensor based on the difference of the first magnetic field density and the sequential second magnetic field density determined by said magnetometer sensor, and thereby to detect the distance between the first and second part of the mobile device.

It is characteristic for a computer program product in accordance with the invention to have computer executable components adapted to control a generation of a first magnetic field density and a sequential second magnetic field density by a magnetic source, a determination of the first and second magnetic field densities by a magnetometer sensor, where a sign of the first determined magnetic field generated by said magnetic field source is opposite than the second determined magnetic field generated by said magnetic field source, and a compensation of an offset difting caused by the magnetic field environment and determination of a distance between the magnetic field source and magnetometer sensor based on the difference of the first magnetic field density and the sequential second magnetic field density determined by said magnetometer sensor.

According to an embodiment of the invention the magnetometer sensor is located in a first part of at least two parts and the magnetic field source is located in a second part of said at least two parts, which parts are adapted to be movable in relation to each other. The parts may be adapted to slide in relation to each other or they may be hinged to each other so that they can be rotated in relation to each other at least around one axis. In an embodiment the parts may be adapted both sliding and rotating in relation to each other. In this document the first part is a reference part and the second part is moving part, but it should be clear to a skilled person when reading the teaching of this document to place the magnetometer sensor to the moving part and the magnetic field source to the reference part, or vice versa.

According to an embodiment of the invention the magnetic field source and magnetometer sensor may be located in the parts such that the output of the magnetometer sensor is in proportion to the distance between the magnetic field source and magnetometer sensor in a line (X-axis). Further, according to another embodiment of the invention the magnetic field source and magnetometer sensor may be located in the parts such that the output of the magnetometer sensor is angle and distance between the magnetic field source and magnetometer sensor in a 2 dimensional (2D; x, y) plane (XY-plane). In addition, according to an embodiment of the invention, the magnetic field source and magnetometer sensor may be located in the parts such that the output of the magnetometer sensor is angle and distance between the magnetic field source and magnetometer sensor in a 3 dimensional (3D; x, y, z) space (XYZ-space). Moreover, the relational speed of the magnetic field source and magnetometer sensor can be determined in every embodiment disclosed in this paragraph, whereupon the relational speed of the first and second part can be derived.

Anyhow, the sensing of the distance and speed of the parts are based on determining the magnetic field densities generated by the magnetic field source and the knowledge, how the field density behaves in function of the distance, and how fast the field density changes. The determined change rate of the field density is proportional to the speed the parts move in relation to each other. The determination of the angles is based on trigonometrically angle calculation.

According to an embodiment of the invention a pulse coil may be used to prevent external magnetic disturbance effects to placement or position measurement by changing the field polarisation. Another possibility is to use a permanent magnet actuator to produce a polarity changing magnetic field. The polarity changing can be achieved in an embodiment of the invention for example by supplying at a first instant a certain current (for example positive current) through the coil and at a second instant by supplying a certain current but of an opposite sign than the first current (negative current). The magnitude of the current at the first instant is advantageously equal with the magnitude of the current at the second instant, but of an opposite sign. Anyhow, it should be noted that the signal shape of the pulse coil is as an impulse, but amplitude can vary as adjusted. Important is only that both the first and second impulses are at the same level of the magnetic field density (but an opposite sign).

According to an embodiment of the invention effects of environmental variations can be prevented by sequential and advantageously fast and synchronized measuring pair events, where at first the magnetic field density (both the direction and magnitude) is measured, when the first current is supplied through the coil, and at second the magnetic field density (both the direction and magnitude) is measured when the second current (which sign is advantageously opposite to the sign of the first current) is supplied through the coil. Now the differential results (and also the relative position of the parts) can be achieved by subtracting the second measured value from the first measured value and taking into account the sign of the direction, for example. Using the method described above effects of temporal magnetic disturbances can be effectively removed.

The invention makes it possible to detect the position of at least one part of an apparatus in relation to an at least one another part of said apparatus. The apparatus may be a mobile device, such as a mobile phone comprising number of parts movable in relation to each other. The first part may be for example a housing of the mobile phone to which the second part is attached in a movable way, such as by a hinge or slide, or even both (hinge+slide). The second part may be a cover, keyboard, camera, display, or some other device attached to the phone in a movable way.

The position detection function performs for example open and close actions, so to detect whether the cover of the phone is in open or close position. The invention makes it possible to detect even a very small change in the relative position of the parts, whereupon numerous additional functionalities and lot of other possible control resolutions can be achieved than only detecting open and close positions. Moreover it should be noted that a multidimensional (e.g. 3D; three dimensional (x, y, z)) magnetometer sensor can be utilized, whereupon more accurate position detection can be achieved and furthermore in many direction (e.g. in 3D).

It should also be noted that according to an embodiment of the invention the measurement may be essentially continuous since the polarity of the magnetic field produced by the magnetic field source can be changed to opposite direction very rapidly and therefore the output signal of the magnetometer sensor is essentially continuous, whereupon also speed of the movement and/or moving part in relation to the reference part can be measured.

However, in order to achieve reliable measurements with the present invention a selection of relative negative and positive magnetic levels produced by the magnetic field source should be defined.

The present invention offers remarkable advantages over the known prior art when detecting, using a contact-free detection technology, a relative position of at least two parts movable in relation to each other. The measurements according to the invention are free from offset and other disturbances. Moreover a distance and direction angle result values are very accurate, and the detection range is wide (typically 5-30 mm). Also a short term position detection or context sensing is possible with the invention. The invention makes possible to use very light magnetic field densities, as well as very light and compact magnetic field sources, which is great advantage for general requirements measurements. Furthermore the present invention offers possibilities also to measure speed component from movements, or speed of actions. In addition the detection is possible in 3D space. Still the difference measurement according to the invention will reduce effects of temperature and non-linearity interdependencies (if symmetric behaviour). Overall a continuous signal from the user interface (UI) is an enhancement, which gives more possibilities to control actions, as will be clear from this document.

BRIEF DESCRIPTION OF THE DRAWINGS

Next the invention will be described in greater detail with reference to exemplary embodiments in accordance with the accompanying drawings, in which FIGS. 10a-b illustrate charts of exemplary distance measurements and angle errors, FIG. 11 illustrate an exemplary method for position detection/context sensing according to an advantageous embodiment of the invention, and FIG. 12 illustrate an exemplary computer program product for position detection/context sensing according to an advantageous embodiment of the invention.

DETAILED DESCRIPTION

Figure 1A:
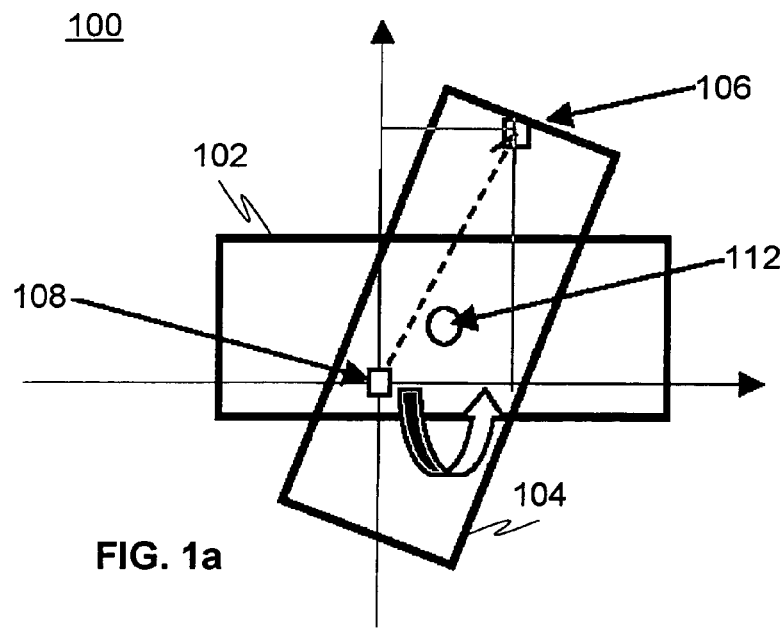
FIGS. 1a-b illustrate a schematic diagram of a mobile device using exemplary principles of detection options according to an advantageous embodiment of the invention.
Figure 1B:
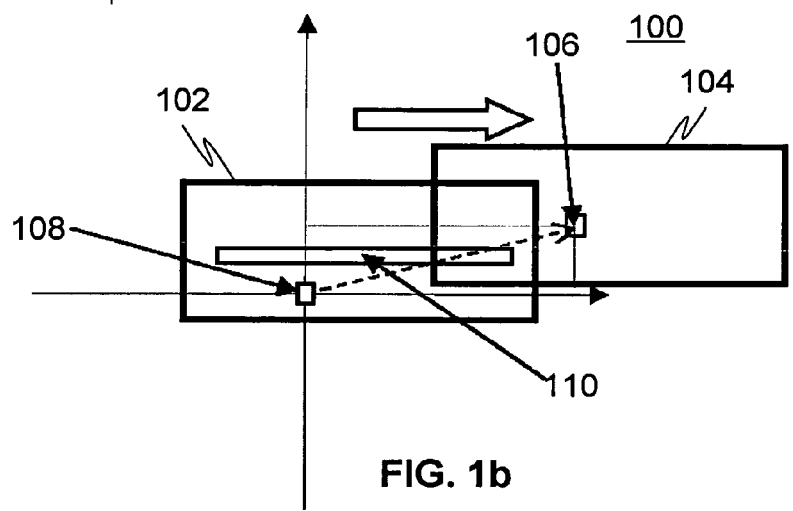

FIGS. 1a and 1b illustrate a schematic diagram of a mobile device 100 using exemplary principles of detection options according to an advantageous embodiment of the invention. The mobile device consisting of at least one first part 102 and at least one second part 104 adapted to be movable in relation to each other comprises advantageously a magnetic field source 106 and a corresponding magnetometer sensor 108.

The mobile device may also comprise a slide construction 110, such as a bar it the first part of the mobile device and its counterpart in the second part of the mobile device. Moreover the mobile device may also comprise a hinge 112, by which the first and second part are attached to each other in a rotatable manner, as can be seen in FIG. 1a where the second part 106 is turned around the hinge 112 in relation to the first part 104. In an embodiment the parts may be adapted both sliding and rotating in relation to each other.

Figure 2A:
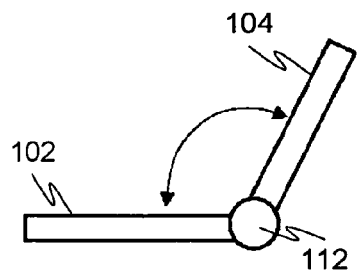
FIGS. 2a-c illustrate a schematic diagram of a mobile device using exemplary applications for position detection/context sensing according to an advantageous embodiment of the invention.
Figure 2B:
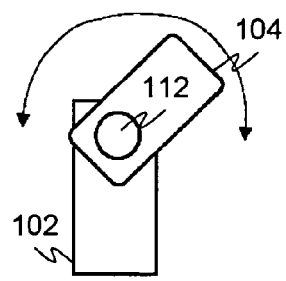
Figure 2C:
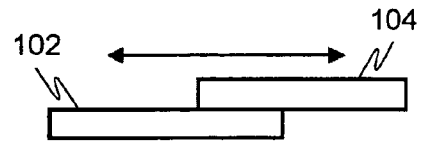

FIGS. 2a-2c illustrate a schematic diagram of a mobile device 100 using exemplary applications for position detection/context sensing according to an advantageous embodiment of the invention. The mobile device 100 consists again of the first part 102, and further the second part 104, which is a lid in a FIG. 2a, a rotating part in a FIG. 2b, and a sliding part in a FIG. 2c. It should be noted that according to an embodiment of the invention all the functionalities illustrated in FIGS. 2a-2c can be combined together, i.e. the second part 104 may be a lid comprising a hinge 112 and sliding construction 110 (not explicitly shown in FIGS. 2a-2c).

The invention offers numerous applications and UI enhancements for mobile devices, such as simple open and close detection and state positioned application. Moreover it offers especially for a lid opening a lid position detection on a segment (e.g. an angle), for rotating part a rotating part position detection on a segment (e.g. an angle), and for sliding part a sliding part position detection on a track.

Figure 3:
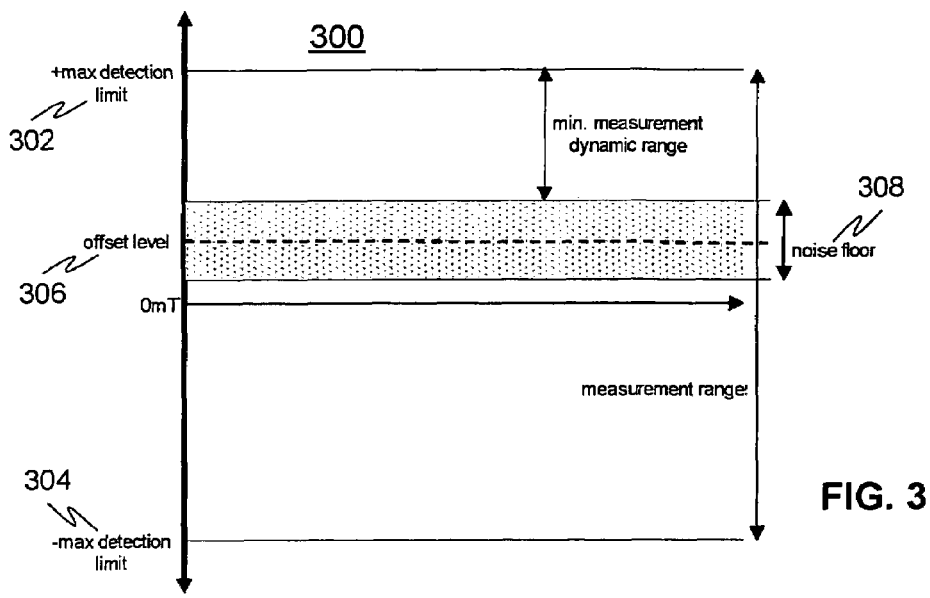
FIG. 3 illustrates an exemplary chart of magnetic detection limits and offset level according to an advantageous embodiment of the invention.

FIG. 3 illustrates an exemplary chart 300 of magnetic detection limits 302, 304 and an offset level 306. There is always a system level offset (constant part) in a magnetic field system. Around the offset level is a noise floor 308 occurring of a magnetic field environment, which is typically noisy. Because of changing environment also the noise level may vary and fluctuate. Offset changes are typically quite fast and unpredictable arising from the unstable environment. A saturated offset is fatal, because it typically prevents measurements.

Figure 4A:
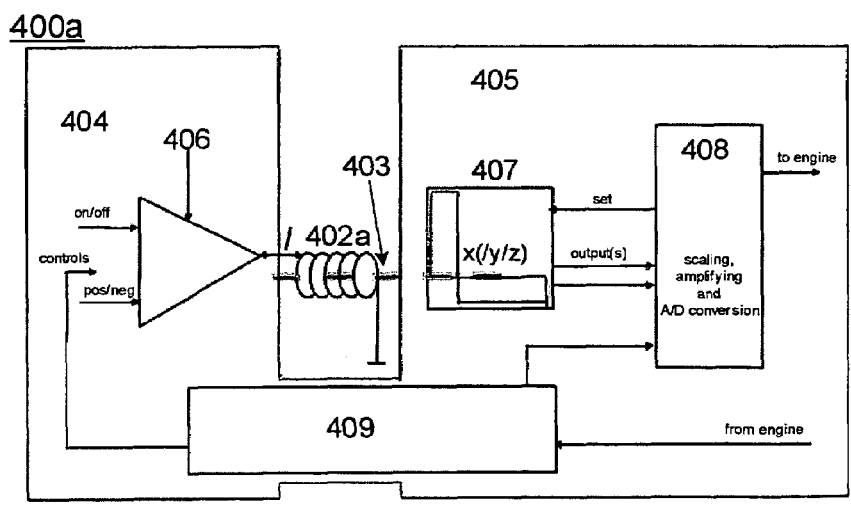
FIG. 4a illustrates a block diagram of an exemplary arrangement using a coil according to an advantageous embodiment of the invention.

FIG. 4a illustrates a block diagram of an exemplary continuous position detection arrangement 400a using a coil 402a in order to generate a changing magnetic field 403. The arrangement comprises advantageously a magnetic field source unit 404 and sensor unit 405, where the sensor unit is adapted to be attached to a first part of the mobile device comprising at least two part movable in relation to each other, and where the magnetic field source unit is adapted to be attached to a second part of said mobile device.

The arrangement advantageously comprises a voltage supply 406 supplying successively positive and negative current through the coil 402a therefore producing a changing polarisation of the magnetic field 403. Further the arrangement comprises a magnetometer sensor 407 sensing the magnetic field density generated by the coil. The arrangement comprises also measurement unit 408 adapted to scale and amplify the output values of the magnetometer sensor, setting e.g. an offset level of the magnetometer sensor, and managing an A/D-conversion (analog to digital). The measurement unit 408 may also generate an output to an engine in order to manage actions based on the position detection.

It can be noticed that a difference between 4a/4b constructions is magnetic field density level in a steady position, e.g. 4a the magnetic field can be adjustable because adjustable current, but 4b construction has essentially the same level magnetic field density.

In addition the arrangement comprises also a control unit 409 controlling the functions of a current driver 410 controlling the voltage supply 406 and thereby also the function of the magnetic field source 402a. Moreover the control unit 409 controls also the functions of the sensor unit 405. Overall the control unit 409 manage the measurement and take care, that the generated changing magnetic field and the measurement (i.e. magnetic field source and magnetometer) are synchronized.

Figure 4B:
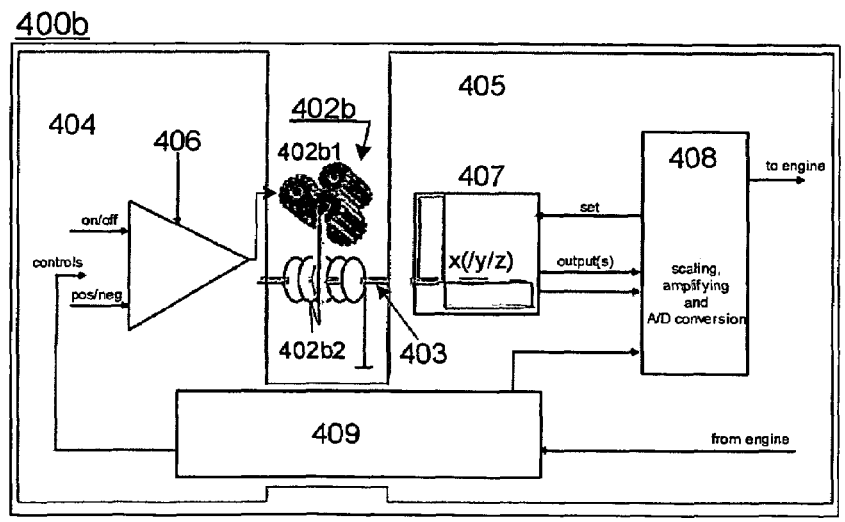
FIG. 4b illustrates a block diagram of an exemplary arrangement using a permanent magnet actuator according to an advantageous embodiment of the invention.

FIG. 4b illustrates a block diagram of an exemplary continuous position detection arrangement 400b using a permanent magnet actuator 402b in order to generate a changing magnetic field 403. Otherwise the composition of the arrangement 400b illustrated in FIG. 4b is similar than the arrangement 400a illustrated in FIG. 4a, but in FIG. 4b the magnetic field source is the permanent magnet actuator.

The permanent magnet actuator 402b comprises an actuator 402b1, and a permanent magnet 402b2. Now the voltage supply 406 supplies voltage for the actuator 402b1 in order to turn the position of the permanent magnet 402b2 and thereby to change to the polarisation of the magnetic field 403.

Figure 5:
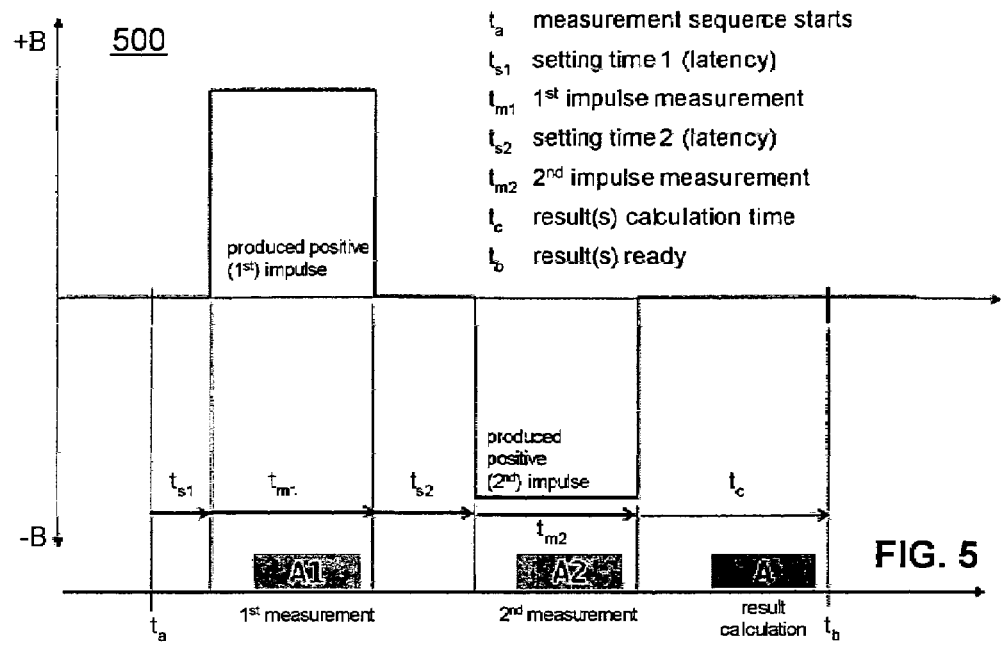
FIG. 5 illustrates an exemplary action timing principles according to an advantageous embodiment of the invention.

FIG. 5 illustrates an exemplary action timing principles 500 according to an advantageous embodiment of the invention, where at a first time instant a measurement sequence is started ($t_a$). There is a setting or latency time ($t_{s1}$) before the magnetic field source can generate an impulse. In FIG. 5 the first impulse is positive impulse, which magnitude is +B. The magnetic field density is measured during $t_{m1}$.

After the first measurement another setting or latency time $t_{s2}$ is applied, followed by the second impulse generated by the magnetic field source. The results are calculated during $t_c$ and they are ready at the moment of $t_b$.

These two measurements form sequential and advantageously fast and synchronized measuring pair events by which the effects of environmental variations can be prevented. The action timing principles illustrated in FIG. 5 are similar for both magnetic field sourced used in the invention, i.e. for a coil and a permanent magnet actuator.

Figure 6:
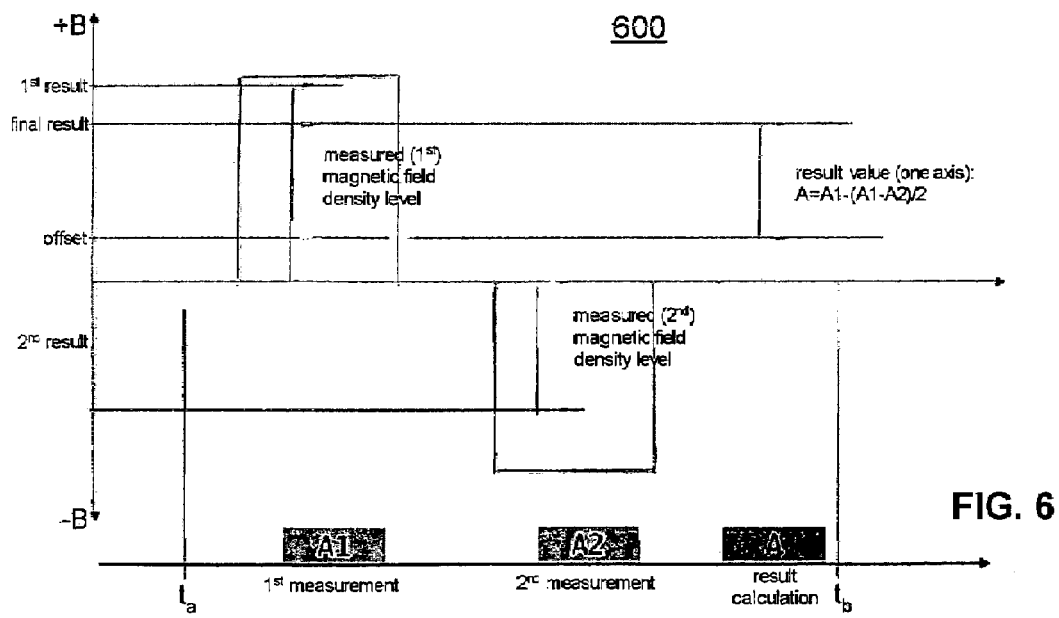
FIG. 6 illustrates an exemplary measurement timing and calculation principles according to an advantageous embodiment of the invention.

FIG. 6 illustrates an exemplary measurement timing and calculation principles 600 according to an advantageous embodiment of the invention, where the measurement is performed by taking short samples (sampling), whereas in an embodiment of the FIG. 5 the measurement time is much longer. The final result value A (when only one axis is used) can be achieved by:

$$A = A1 - \frac{A1 - A2}{2},$$

where A1 is the value of the first measurement and A2 is the value of the second measurement.

Figure 7:
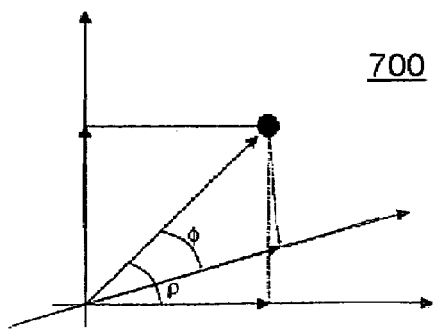
FIG. 7 illustrates an exemplary coordinate calculation principle according to an advantageous embodiment of the invention.

FIG. 7 illustrates an exemplary coordinate calculation principle 700 according to an advantageous embodiment of the invention in 3D space. One axis measurements results are a distance (amplitude) and sign (direction) of magnetic field density taking into account negative or positive values. Two or three axes output results values after calculation are calculated total distance (D=value without sign) and calculated angles α(φ, ρ) (information of quadrant pointed). The relative speed of the magnetic field source and magnetometer sensor can be calculated from the previous values, such as distances and time between the sequential measurements.

In an application level the distance and angle values are used to calculate equipment level co-ordinates for final movement track or other actions based on the relative position or speed of the moving parts of the mobile device.

Figure 8:
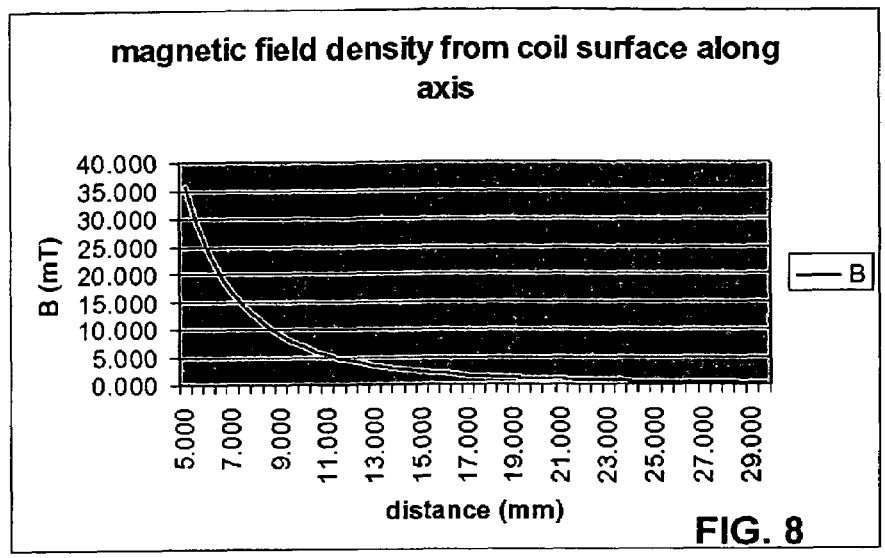
FIG. 8 illustrates an exemplary chart of magnetic field density from the surface of the used magnetic field source in a function of a distance according to an advantageous embodiment of the invention.

FIG. 8 illustrates an exemplary chart 800 of magnetic field density from the surface of the used magnetic field source in a function of a distance. The magnetic field density is proportional to a square of the distance, as can be seen from the FIG. 8. The position can be derived from the following equation, when the magnetic field density B is first determined, and when the magnetic field source is a coil:

$$B = \frac{\mu_0 i r^2}{2(r^2 + x^2)^{3/2}};$$

where $\mu_0$=relative permeability; i=current; r=coil radius; and x=distance along coil axis.

For permanent magnet the position can be derived from the following equation, when the magnetic field density B is first determined:

$$B = \frac{1}{2} \cdot q \cdot w \cdot d \cdot \frac{jm}{(\pi \cdot r^3)}$$

where q magnet length, w=magnet width, d=magnet height, jm=magnet material constant, and r=distance.

Figure 9A:
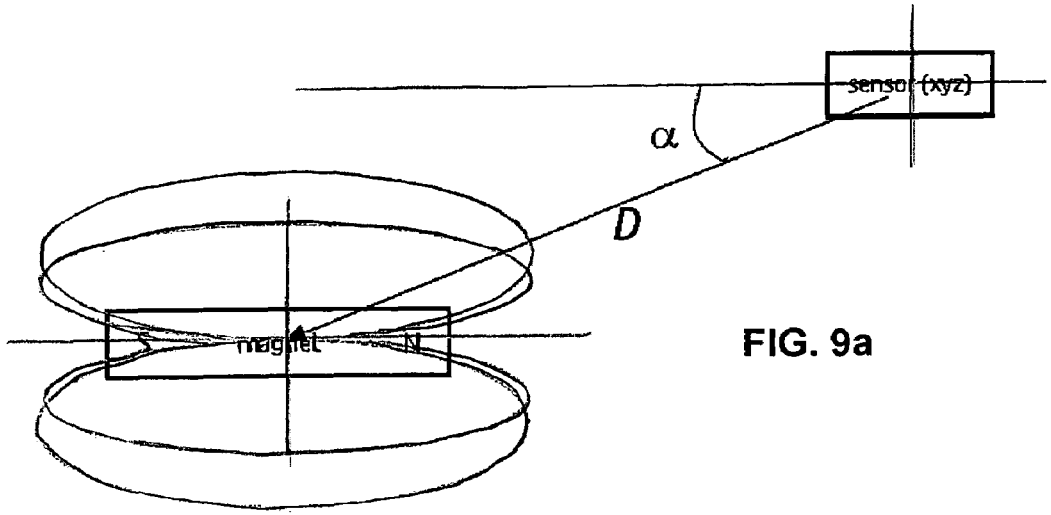
FIGS. 9a-b illustrate an exemplary of a produced magnetic field and two axes system according to an advantageous embodiment of the invention.

FIG. 9a illustrate an exemplary of a produced magnetic field according to an advantageous embodiment of the invention, where it can be seen that the powered coil or permanent magnet has a specified magnetic field around the environment. It is advantageous to direct the main field to most used direction.

Figure 9B:
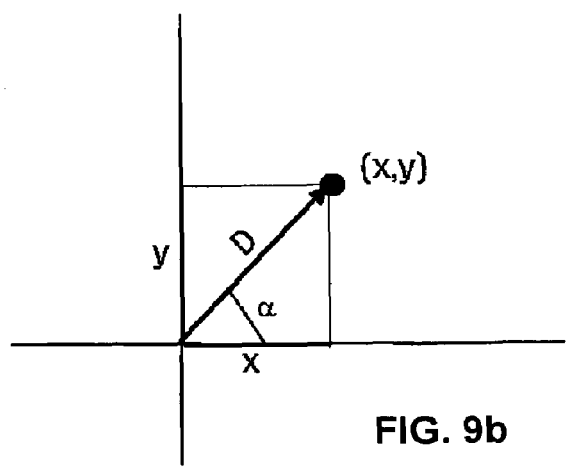

FIG. 9b illustrate an exemplary two axes system, where D is the distance and α is the angle between the x and y axes. The distance D can be derived from coordinates as:

$$D = \sqrt{x^2 + y^2 + z^2}$$

and the angles (α in the x and y plane, and ρ and φ in 3D environment) as:

$$\alpha = \tan^{-1}(y/x),$$
$$\phi = \tan^{-1}\left(\frac{x}{y^2 + z^2}\right), \text{ and}$$
$$\rho = \tan^{-1}\left(\frac{y}{x^2 + z^2}\right).$$

FIGS. 10a-10b illustrate charts of exemplary distance measurements and angle errors, when magnetometer sensor with resolution of 10 μT is used and where the measurement range is ±10 mT. The magnetic field density was 7 mT at the distance of 6 mm. In FIG. 10 a reference and simulated measurements are plotted. From the FIG. 10b can be seen that the angle error increases when the distance increases being however very small or at least in the permitted limits at the short distances.

FIG. 11 illustrate an exemplary method for position detection/context sensing according to an advantageous embodiment of the invention, where a measurement sequence is started in step 1100. At first the magnetic field source generates a first impulse at step 1102, which is measured by a magnetometer sensor at step 1104. The steps 1102 and 1104 are managed advantageously in a synchronized way. After the first measurement (steps 1102 and 1104) the magnetic field source generates a second impulse at step 1106, which magnitude is advantageously equal with the magnitude of the first impulse, but its sign is opposite (lets say that the first field is positive and the second one is negative), which is again measured by the magnetometer sensor at step 1108. The fact that the sign of the magnetic field is opposite means that the field polarization is changed to opposite. Also the steps 1106 and 1108 are managed advantageously in a synchronized way. The steps 1102/1104 and 1106/1106 form a measurement pair event.

After measurement the final result, such as distance and angle(s) are determined from the sequentially measured magnetic field densities at step 1110 as described above in this document. Also the relative speed of the magnetic field source and magnetometer sensor can be determined if at least two sequential measurement pair events have been measured, because the speed determination is based on the distance changing in the function of time.

FIG. 12 illustrate an exemplary computer program product 1200 for position detection/context sensing according to an advantageous embodiment of the invention, where the computer program product have computer executable components 1202-1208 adapted to control the measurement process steps 1102-1108 described in connection with FIG. 11. A voltage supply component 1202 controls the voltage supply to the magnetic field generator in order to generate an appropriate first magnetic field 1102 and an appropriate second magnetic field in step 1106. A magnetometer sensor component 1204 controls the function of magnetometer sensor in order to read the magnetic field density at an appropriate instant, such as measuring the magnetic field density at step 1104 and 1108. Moreover a controlling component 1206 controls the synchronization of the measuring operation of the magnetic field source and the magnetometer sensor. In addition a management component 1208 manages the measured values of the magnetic field densities and determines, based on the measured values, the distance, angle(s) and also the speed of the first and second parts of the mobile device, if possible (so if enough data is collected).

The invention has been explained above with reference to the aforementioned embodiments, and several advantages of the invention have been demonstrated. It is clear that the invention is not only restricted to these embodiments, but comprises all possible embodiments within the spirit and scope of the inventive thought and the following patent claims. For example the sign of the determined magnetic field density can be achieved by changing the current supplied through the coil or turning a permanent magnet around its axis, but also keeping the magnetic field steady and turning the magnetometer sensor around its axis.

The invention claimed is:

1. An apparatus comprising:
   a magnetic field source configured to generate a first magnetic field density of a first magnetic field with a first field polarization and, at a later time, a sequential second magnetic field density of a second magnetic field with a second field polarization, where the second field polarization differs from the first field polarization,
   a magnetometer sensor configured to determine said two different sequential magnetic field densities of said magnetic fields with the different field polarization generated by said one magnetic field source, and
   a measurement unit configured to determine a distance between the magnetic field source and magnetometer sensor based on a difference of the first magnetic field density and the sequential second magnetic field density determined by said magnetometer sensor and to compensate an offset drifting caused by a magnetic field environment based at least in part on the determined distance.

2. An apparatus according to claim 1, wherein the magnetic field source is a coil operated by a current supply.

3. An arrangement according to claim 1, wherein the magnetic field source is a permanent magnet and a polarity of the magnetic field is changed turning the permanent magnet around its axis by an actuator.

4. An arrangement according to claim 1, wherein the magnetometer sensor is 1 to 3 dimensional magnetometer sensor.

5. An apparatus according to claim 1, wherein the magnetometer sensor is further configured to determine a relational speed of the magnetic field source and the magnetometer sensor.

6. An apparatus according to claim 1, wherein the magnetometer sensor is at least a 2 dimensional magnetometer sensor and the magnetometer sensor is further configured to determine an angle between the magnetic field source and the magnetometer sensor.

7. A method comprising:
   generating by a magnetic field source of a first magnetic field density of a first magnetic field with a first field polarization and, at a later time, generating a sequential second magnetic field density of a second magnetic field with a second field polarization, where the second field polarization differs from the first field polarization,
   determining said two different sequential magnetic field densities of said magnetic fields with the different field polarization generated by said one magnetic field source by a magnetometer sensor,
   determining a distance between the magnetic field source and magnetometer sensor based on a difference of the first magnetic field density and the sequential second magnetic field density determined by said magnetometer sensor, and
   compensating an offset drifting caused by a magnetic field environment based at least in part on the determined distance.

8. A method according to a claim 7, wherein the magnetic field source is a coil operated by a current supply.

9. An arrangement according to claim 7, wherein the magnetic field source is a permanent magnet and a polarity of the magnetic field is changed turning the permanent magnet around its axis by an actuator.

10. An arrangement according to claim 7, wherein the magnetometer sensor is 1 to 3 dimensional magnetometer sensor.

11. An arrangement according to claim 7, wherein a relational speed of the magnetic field source and the magnetometer sensor is also determined.

12. An arrangement according to claim 7, wherein the magnetometer sensor is at least 2 dimensional magnetometer sensor and an angle between the magnetic field source and the magnetometer sensor is also determined.

13. A mobile device comprising:
   a first part and a second part movable attached to said first part, a magnetic field source in said first part configured to generate a first magnetic field density of a first magnetic field with a first field polarization and to generate, at a later time, a sequential second magnetic field density of a second magnetic field with a second field polarization, where the second field polarization differs from the first field polarization, a magnetometer sensor in said second part configured to determine said two different sequential magnetic field densities of said magnetic fields with the different field polarization generated by said one magnetic field source, and a measurement unit configured to determine of a distance between the magnetic field source and magnetometer sensor based on a difference of the first magnetic field density and the sequential second magnetic field density determined by said magnetometer sensor, and thereby to determine the distance between the first and second part of the mobile device, and to compensate an offset drifting cuased by a magnetic field environment based at least in part on the determined distance between the first and second part of the mobile device.

14. A mobile device according to claim 13, wherein the magnetic field source is a coil operated by a current supply.

15. A mobile device according to claim 13, wherein the magnetic field source is a permanent magnet and a polarity of the magnetic field is changed by turning the permanent magnet around its axis by an actuator.

16. A mobile device according to claim 13, wherein the magnetometer sensor is a 1 to 3 dimensional magnetometer sensor.

17. A mobile device according to claim 13, wherein the measurement unit is further configured to determine a relational speed of the magnetic field source and the magnetometer sensor, and thereby the relational speed of the first and second part of the mobile device.

18. A mobile device according to claim 13, wherein the magnetometer sensor is at least a 2 dimensional magnetometer sensor and the measurement unit is further configured to determine an angle between the magnetic field source and the magnetometer sensor, and thereby the angle between the first and second part of the mobile device.

19. A mobile device according to claim 13, wherein the mobile device is a mobile phone.

20. A mobile device according to claim 13, wherein the parts are configured to slide in relation to each other.

21. A mobile device according to claim 13, wherein the parts are rotatably hinged to each other around at least one axis.

22. A computer program product comprising machine readable instructions stored on a computer readable medium having computer executable components configured to control:

a generation by a magnetic field source of a first magnetic field density of a first magnetic field with a first field polarization and, at a later time, generation of a sequential second magnetic field density of a second magnetic field with a second field polarization, where the second field polarization differs from the first field polarization, a determination of said two different sequential magnetic field densities of said magnetic fields with the different field polarization generated by said one magnetic field source by a magnetometer sensor, a determination of a distance between the magnetic field source and magnetometer sensor based on a difference of the first magnetic field density and the sequential second magnetic field density determined by said magnetometer sensor, and a compensation of an offset drifting caused by a magnetic field environment based at least in part on the determined distance.

23. A computer program product according to claim 22, having further a computer executable component configured to control a current supply operating a coil generating the magnetic field.

24. A computer program product according to claim 22, having further a computer executable component configured to control a changing of a polarity of the magnetic field generated by a permanent magnet by turning the permanent magnet around its axis by an actuator.

25. A computer program product according to claim 22, having further a computer executable component configured to control a determination of a relational speed of the magnetic field source and the magnetometer sensor, and thereby the relational speed of the first and second part of the mobile device.

26. A computer program product according to claim 22, having further a computer executable component configured to control a determination of an angle between the magnetic field source and the magnetometer sensor, and thereby the angle between the first and second part of the mobile device, when the magnetometer sensor is at least a 2 dimensional magnetometer sensor.

* * * * *

UNITED STATES PATENT AND TRADEMARK OFFICE
CERTIFICATE OF CORRECTION

PATENT NO. : 7,612,559 B2
APPLICATION NO. : 11/480024
DATED : November 3, 2009
INVENTOR(S) : Vesa Koivuaho It is certified that error appears in the above-identified patent and that said Letters Patent is hereby corrected as shown below:

IN THE CLAIMS:

In Claim 3: Column 10, line 15, delete "arrangement" and replace with --apparatus--;

Column 10, line 17, after "changed" insert --by--.

In Claim 4: Column 10, line 19, delete "arrangement" and replace with --apparatus--.

In Claim 9: Column 10, line 51, delete "An arrangement" and replace with --A method--;

Column 10, line 53, after "changed" insert --by--.

In Claim 10: Column 10, line 55, delete "An arrangement" and replace with --A method--.

In Claim 11: Column 10, line 58, delete "An arrangement" and replace with --A method--.

In Claim 12: Column 10, line 61, delete "An arrangement" and replace with --A method--.

Signed and Sealed this

Twenty-second Day of December, 2009

David J. Kappos
*Director of the United States Patent and Trademark Office*